United States Patent [19]

Endo et al.

[11] Patent Number: 5,225,716
[45] Date of Patent: Jul. 6, 1993

[54] SEMICONDUCTOR INTEGRATED CIRCUIT HAVING MEANS FOR SUPPRESSING A VARIATION IN A THRESHOLD LEVEL DUE TO TEMPERATURE VARIATION

[75] Inventors: Toru Endo; Yoshinori Okajima, both of Kawasaki, Japan

[73] Assignee: Fujitsu Limited, Kawasaki, Japan

[21] Appl. No.: 959,467

[22] Filed: Oct. 9, 1992

Related U.S. Application Data

[63] Continuation of Ser. No. 761,290, Sep. 17, 1991, abandoned.

[30] Foreign Application Priority Data

Sep. 17, 1990 [JP] Japan .................. 2-246841

[51] Int. Cl.5 .................. H03K 3/01; H01L 31/00
[52] U.S. Cl. .................. 307/296.8; 307/296.7; 307/310; 307/363; 307/491
[58] Field of Search .................. 307/296.6, 310, 363, 307/491, 296.8, 475

[56] References Cited

U.S. PATENT DOCUMENTS

| | | | |
|---|---|---|---|
| 3,648,153 | 3/1972 | Graf | 307/296.6 |
| 4,015,149 | 3/1977 | Tsunekawa et al. | 307/310 |
| 4,313,083 | 1/1982 | Gilbert et al. | 307/296.6 |
| 4,350,904 | 9/1982 | Cordell | 307/296.6 |
| 4,352,053 | 9/1982 | Oguchi et al. | 307/310 |
| 4,410,813 | 10/1983 | Barker et al. | 307/296.8 |
| 4,430,582 | 2/1984 | Bose et al. | 307/296.8 |
| 4,461,992 | 7/1991 | Yamaguchi et al. | 307/296.6 |
| 4,584,492 | 4/1986 | Sharp | 307/296.8 |
| 4,763,021 | 8/1988 | Stickel | 307/296.8 |
| 4,883,992 | 11/1989 | Koglin et al. | 307/491 |
| 4,902,915 | 2/1990 | Tran | 307/296.6 |
| 4,943,737 | 7/1990 | Guo et al. | 307/310 |
| 4,956,567 | 9/1990 | Hunley et al. | 307/310 |
| 4,990,846 | 2/1991 | Buck et al. | 307/310 |

Primary Examiner—William L. Sikes
Assistant Examiner—Terry D. Cunningham
Attorney, Agent, or Firm—Staas & Halsey

[57] ABSTRACT

A semiconductor integrated circuit includes an input circuit having a CMOS inverter and receiving an input signal. The input circuit has a threshold level which determines an output level of the input circuit with respect to the input signal. The integrated circuit includes an internal circuit receiving the input signal via the input circuit, the internal circuit receiving a first power supply voltage. A power source generates a second power supply voltage applied to the input circuit so that the second power supply voltage changes to cancel a change in the threshold level due to a temperature variation.

12 Claims, 3 Drawing Sheets

SEMICONDUCTOR INTEGRATED CIRCUIT HAVING MEANS FOR SUPPRESSING A VARIATION IN A THRESHOLD LEVEL DUE TO TEMPERATURE VARIATION

This application is a continuation of application Ser. No. 07/761,290, filed Sep. 17, 1991.

BACKGROUND OF THE INVENTION

1. Field of the Invention

The present invention generally relates to semiconductor integrated circuits, and more particularly to a semiconductor integrated circuit having means for suppressing a temperature-related variation in a threshold level.

2. Description of the Related Circuit

Generally, an integrated circuit formed on a semiconductor chip is composed of an input circuit, an internal circuit and an output circuit, as shown in FIG. 1A. A common power supply line L is provided in common to the input circuit, the internal circuit and the output circuit. Electricity is supplied to the input circuit, the internal circuit and the output circuits via a pair of power supply lines, one of which is maintained at a high potential and the other one of which is maintained at a low potential. The common power supply line L shown in FIG. 1A is one of the pair of power supply lines.

Generally, the output circuit consumes much more energy than the input circuit and the internal circuit. Thus, when a large number of internal elements, such as transistors, executes a switching operation, a large variation occurs in current passing through the output circuit. This current variation causes a change in potential of the power supply line L. This change in potential of the power supply line L causes various problems in the input circuit and/or the internal circuit.

When the input circuit is composed of CMOS (Complementary Metal Oxide Semiconductor) elements, it includes a CMOS inverter. When the input circuit is composed of a BiCMOS (Bipolar-Metal Oxide Semiconductor) circuit, the input circuit includes a CMOS inverter in the first stage of the BiCMOS circuit.

The CMOS inverter has a threshold level Vth. When an input signal has a level higher than the threshold level Vth, the CMOS inverter outputs a low-level signal. When the input signal has a level lower than the threshold level Vth, the CMOS inverter outputs a high-level signal. The CMOS inverter is composed of a p-channel MOS transistor (hereafter simply referred to as a pMOS transistor) and n-channel MOS transistor (hereafter simply referred to as an nMOS transistor), both of which are connected in series.

FIG. 1B is a graph of drain voltage ($V_{DD}$) vs. drain current ($I_D$) characteristics of the pMOS and nMOS transistors. $V_{i1}$ through $V_{i5}$ are gate voltages of the pMOS and nMOS transistors. Reference numerals ① through ⑤ indicate cross points where the $V_{DD}-I_D$ characteristics of the pMOS transistor cross those of the nMOS transistor. At cross point ①, the nMOS transistor is OFF, and the pMOS transistor is ON. At cross point ②, the nMOS transistor operates in a saturated area, and the pMOS transistor operates in a linear area. At cross point ③, both the nMOS and pMOS transistors operate in respective saturated areas. At cross point ④, the nMOS transistor operates in a linear area, and the pMOS transistor operates in the saturated area. At cross point ⑤, the nMOS transistor is ON, and the pMOS transistor is OFF. The threshold level Vth corresponds to a drain voltage obtained at cross point ③. That is, the threshold level Vth corresponds to an identical drain voltage of the pMOS and nMOS transistors when these transistors are in the saturated areas. When the nMOS and pMOS transistors have good complementary characteristics (for example, when $\beta n = \beta p$ and Vthn = Vthp where $\beta n$ and $\beta p$ are, respectively, current transfer ratios of the nMOS and pMOS transistors and Vthn and Vthp are respectively the threshold levels of the nMOS and the pMOS transistors), the threshold level Vth of the CMOS inverter is equal to $V_{DD}/2$.

The drain current $I_D$ of a MOS transistor when it is in the saturated area can be written as follows:

$$I_D = \beta(Vin - Vth)^2/2$$

$$\beta = \mu Cox W/L$$

where $\beta$ is the current transfer ratio of the MOS transistor, Vin is the input voltage applied to the MOS transistor, $\mu$ is the mobility, Cox is the thickness of an oxide film, W is the width of the gate of the MOS transistor, and L is the length thereof.

The mobility $\mu$ of the MOS transistor decreases as its temperature increases. Hence, as temperature increases, both the current transfer ratio $\beta$ and the drain current $I_D$ decrease. Since the mobility of holes is much greater than that of electrons, diminutions in $\mu$, $\beta$ and $I_D$ of the pMOS transistor due to temperature variations are greater than those of the nMOS transistor. Thus, as shown in FIG. 1C, the cross point ③ moves to a cross point ③', and thus, the threshold level Vth of the CMOS inverter increases. This change in the threshold level Vth causes malfunctions of the input circuit.

SUMMARY OF THE INVENTION

It is a general object of the present invention to provide a semiconductor integrated circuit in which the above disadvantage is eliminated.

A more specific object of the present invention is to provide a semiconductor integrated circuit in which a variation in the threshold level of the input circuit due to temperature variations can be suppressed through an improvement in the power supply system.

The above objects of the present invention are achieved by a semiconductor integrated circuit which comprises an input circuit having a CMOS inverter and receiving an input signal, the input circuit having a threshold level which determines the output level of the input circuit with respect to the input signal; an internal circuit receiving the input signal via the input circuit, the internal circuit receiving a first power supply voltage; and a temperature-compensated power source, coupled to the input circuit, for generating a second power supply voltage applied to the input circuit so that the second power supply voltage changes to cancel a change in the threshold level due to a temperature variation.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENT

Figure 2:
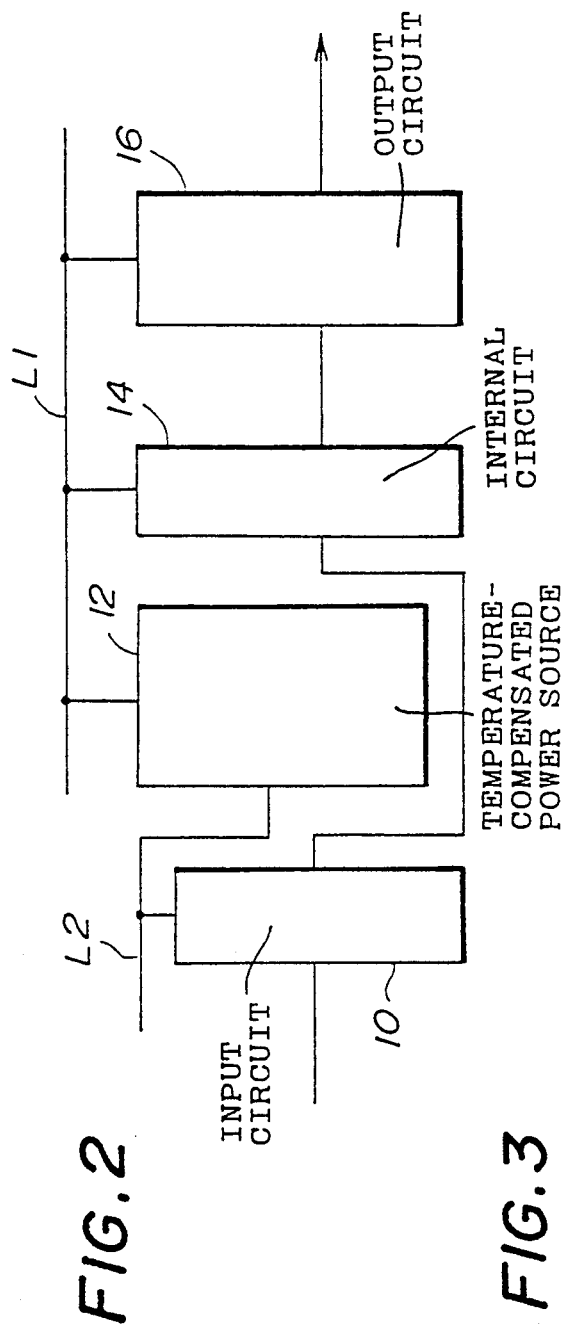
FIG. 2 is a block diagram showing an outline of the present invention.

FIG. 2 shows an outline of the present invention. An integrated circuit shown in FIG. 2 is comprises an input circuit 10, a temperature-compensated power source 12, an internal circuit 14 and an output circuit 16. The temperature-compensated power source 12, the internal circuit 14 and the output circuit 16 are commonly connected to a power supply line L1, which is maintained at a first power supply voltage $V_{CC}$ (potential with respect to a ground level). The temperature-compensated power source 12 generates a second power supply voltage Vcont which changes due to temperature variations. That is, the threshold voltage level of the CMOS inverter of the input circuit 10 remains constant even when the first power supply voltage $V_{CC}$ changes due to a temperature variation. The internal circuit 14 is, for example, a memory cell array, a logic circuit, a gate array, a standard cell array or the like. The output circuit 16 includes, for example, a driving circuit for amplifying a signal from the internal circuit 14 and outputting an amplified signal to a next-stage circuit or an external device.

Figure 3:
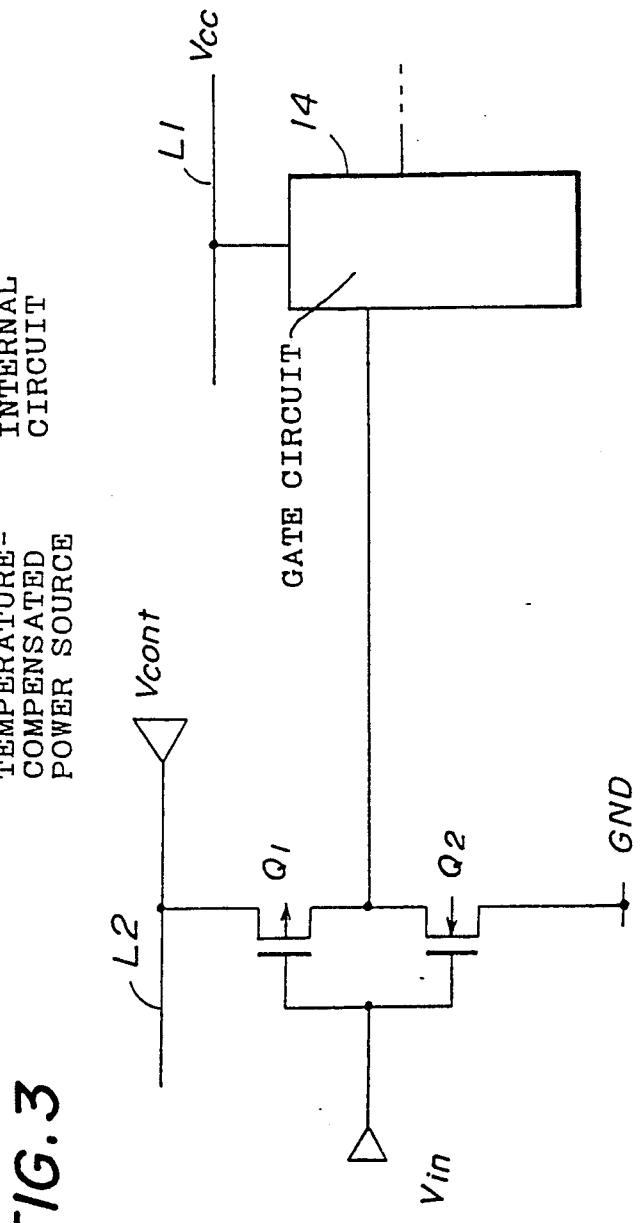
FIG. 3 is a circuit diagram of an input circuit shown in FIG. 2.

As shown in FIG. 3, the input circuit 10 includes a CMOS inverter composed of a pMOS transistor Q1 and an nMOS transistor Q2, both which are connected in series between the power supply line L2 and the ground. An input voltage Vin is applied to the gates of the nMOS and pMOS transistors Q1 and Q2. An output voltage of the CMOS inverter is applied to the internal circuit 14. As has been described previously, the threshold of the CMOS inverter increases as the temperature increases. The second power supply voltage Vcont generated by the temperature-compensated power source 12 decreases as the temperature increases.

Figure 4:
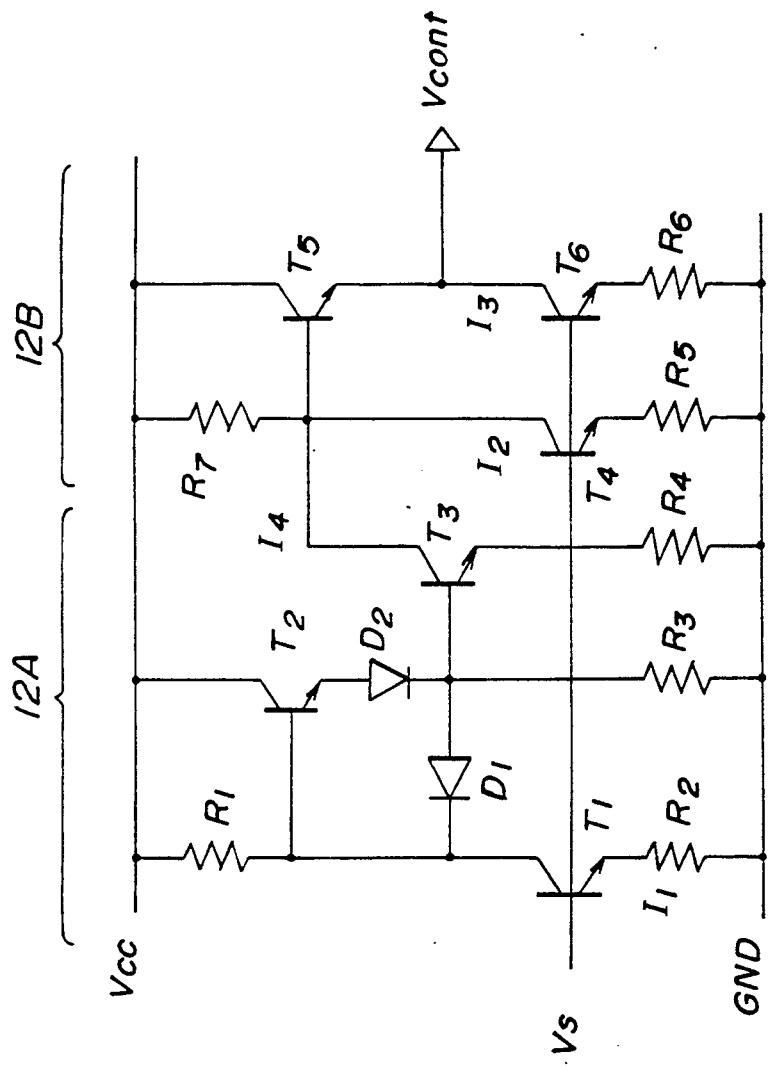
FIG. 4 is a circuit diagram of a temperature-compensated power source shown in FIG. 2.

FIG. 4 is a circuit diagram of the temperature-compensated power source 12 shown in FIG. 2. As shown in FIG. 4, the temperature-compensated power source 12 comprises a temperature compensating block 12A and a voltage setting block 12B. The temperature compensatinq block 12A is comprised of transistors T1, T2 and T3, diodes D1 and D2 and resistors R1, R2, R3 and R4. The voltage setting block 12B is composed of transistors T4, T5 and T6, and resistors R5, R6 and R7.

The transistor T1 and the resistor R2 form a constant-current source, which generates a constant current I1 based on the resistor R2 and a fixed voltage Vs from an external circuit. The transistor T4 and the resistor R5 form a constant-current source, which generates a constant current I2 based on the resistor R5 and the fixed voltage Vs. The transistor T6 and the resistor R6 form a constant-current source, which generates a constant current I3 based on the resistor R6 and the fixed voltage Vs.

A current passes from the power supply line L1 ($V_{CC}$) to a ground line (having the ground level GND) via the resistor R1, the base and emitter of the transistor T2, the diode D2, the base and emitter of the transistor T3 and the resistor R4. Thus, the transistors T2 and T3 are ON, and a current I4 passes from the power supply line L1 to the ground line via the resistor R7, the transistor T3 and the resistor R4. At this time, a voltage drop is developed across the resistor R7 due to the currents I2 and I4 and the base current of the transistor T5. The output voltage Vcont is equal to the voltage obtained by subtracting from the power supply voltage $V_{CC}$, the sum of the voltage drop developed across the resistor R7, and the base-emitter voltage $V_{BE}$ of the transistor T5 (equal to about 0.8 V).

For example, $V_{CC}$=5.2 V, R1=14 kΩ, I1=0.2 mA and I2=0.04 mA. When $V_{BE} \approx 0.8$ V and the voltage drop of the diode D2 is $\approx 0.8$ V, the emitter of the transistor T3 has a potential of 0 V. In this state, there is less current passing through the transistor T3 even though the transistor T3 is ON. Thus, normally, the base potential of the transistor T5, that is, the output voltage Vcont is determined by the current I2 and the resistor R7.

The diode D2 has a voltage drop $V_F$ (junction potential) equal to about 0.8 V in the ON state. The voltage drop $V_F$ of the diode D2 decreases as the temperature increases. Thus, the current passing from the power supply line L1 to the ground line via R1, T2, D2, T3 and R4 increases as the temperature increases, and thus the transistor T3 increases the current I4. Thus, the voltage drop developed across the resistor R7 increases, and the output voltage Vcont decreases. The magnitude of the decrease in the output voltage Vcont can be adjusted by the collector current I4 and the resistor R7. In the manner described above, it becomes possible to suppress an increase in the threshold level Vth of the input circuit 10 due to an increase in the temperature.

Figure 1B:
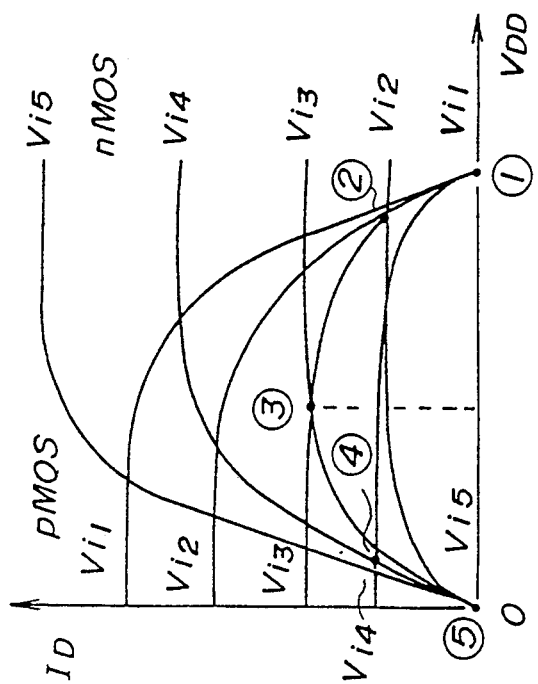
FIG. 1B is a graph of characteristics of pMOS and nMOS transistors which form a CMOS inverter.
Figure 1A:
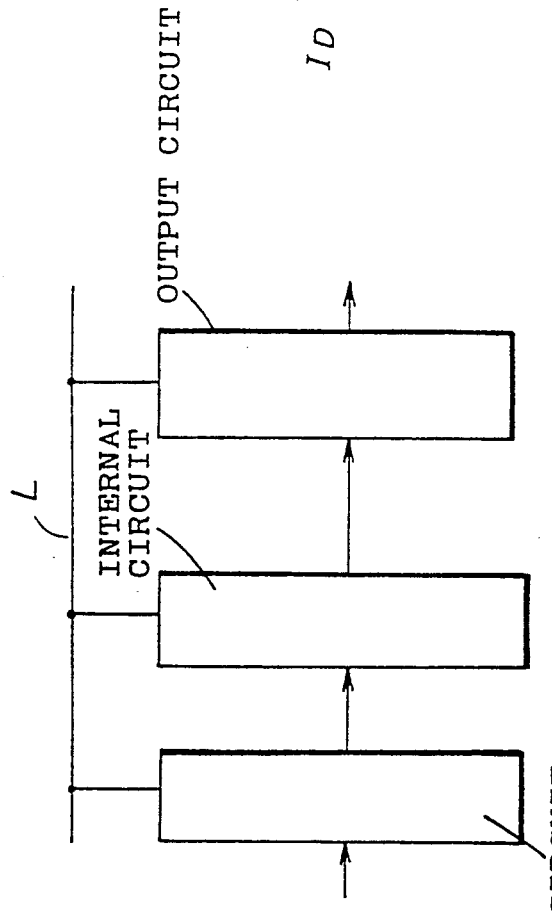
FIG. 1A is a block diagram of a conventional semiconductor integrated circuit.
Figure 1C:
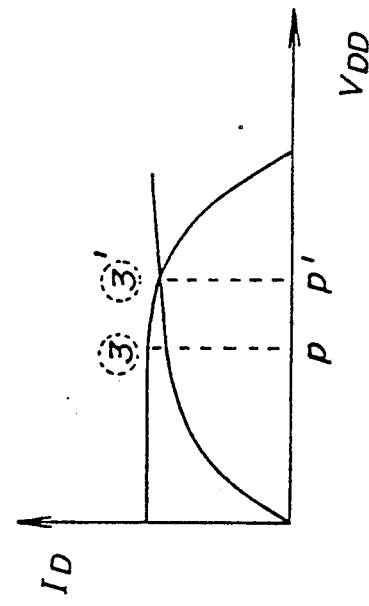
FIG. 1C is a graph showing a disadvantage of the CMOS inverter.

It can be seen from FIG. 1C that the threshold level Vth of the input circuit 10 can be adjusted by adjusting the power supply voltage Vcont applied to the input circuit 10. That is, although the cross point ③ tends to move to the cross point ③' temperature increases, because the power supply voltage Vcont decreases as the temperature increases, a decrease in the power supply voltage Vcont prevents the cross point ③ from moving to the cross point ③'. In this manner it becomes possible to maintain the position of the cross point 3 even though the temperature changes.

The present invention is not limited to the specifically disclosed embodiment, and variations and modifications may be made without departing from the scope of the present invention.

What is claimed is:

1. A semiconductor integrated circuit comprising:
   an input circuit having a CMOS inverter of first and second series-connected transistors having respective gates connected in common at a connection node, the input circuit receiving an input signal at the connection node and emitting an output signal, said input circuit having a threshold level which determines the level of the output signal of the input circuit with respect to the level of the input signal, the threshold level varying as a function of variations of the temperature of the CMOS inverter;
   an internal circuit receiving said output signal of said input circuit and a first power supply voltage; and
   power source means, coupled to said input circuit and having an output node and a constant current source connecting the output node to a reference node, for receiving the first power supply voltage and further receiving at the reference node a reference power supply voltage of a level different from the level of the first power supply voltage, for generating, at the output node, a second power supply voltage having a level which varies, independently of the input signal and within a range intermediate the respective levels of the first power supply voltage and the reference power supply voltage, as a function of temperature and for supplying the second power supply voltage to said input circuit, said input circuit responding to the variations in the level of the second power supply voltage to cancel variations in the threshold level due to temperature variations.

2. A semiconductor integrated circuit as claimed in claim 1, wherein said power source means comprises means for increasing the second power supply voltage as the temperature decreases and for decreasing the second power supply voltage as the temperature increases.

3. A semiconductor integrated circuit as claimed in claim 1, wherein said power source means comprises:
a transistor having a collector receiving said first power supply voltage, an emitter connected to the output node at which said second power supply voltage is output, and a base; and
temperature compensating means, responsive to the variations in temperature of the CMOS inverter and coupled to said transistor, for generating a base voltage and applying the base voltage to the base of said transistor so that the base voltage changes due to the temperature variations.

4. A semiconductor integrated circuit as claimed in claim 3, wherein said temperature compensating means comprises means for generating the base voltage so that the base voltage decreases as the temperature increases.

5. A semiconductor integrated circuit as claimed in claim 1, wherein said power source means comprises:
first, second and third constant current sources, the third constant current source comprising the constant current source connecting the output node to the reference node;
a first transistor having a collector receiving said first power supply voltage, a base and an emitter;
a first constant-current source being connected between a base of said first transistor and said reference node set at the reference voltage, the level thereof being lower than the level of said first power supply voltage;
a first resistor connected between the collector and base of said first transistor;
a first diode having an anode connected to the emitter of said first transistor and a cathode;
a second transistor having a base connected to the cathode of said first diode, a collector and an emitter connected through a resistive conductive path to the reference node;
a second resistor coupled between the base of the second transistor and said reference node;
a third transistor having a collector receiving said first supply voltage, a base connected to the collector of said second transistor, and an emitter connected to the output node at which said second power supply voltage is produced;
a third resistor connected between the collector and the base of said third transistor; and the second constant-current source being connected between the base of said third transistor and said reference node.

6. A semiconductor integrated circuit as claimed in claim 5, wherein said power source means further comprises a second diode having an anode connected to the cathode of said first diode and a cathode connected to the base of said first transistor.

7. A semiconductor integrated circuit as claimed in claim 6, wherein said first, second and third constant-current sources have respective control terminals receiving a common control voltage which determines the amounts of constant currents respectively generated by said first, second and third constant-current sources.

8. A semiconductor integrated circuit as claimed in claim 1, further comprising an output circuit amplifying a signal from said internal circuit, said output circuit receiving said first power supply voltage.

9. A semiconductor integrated circuit comprising:
an input circuit having a CMOS inverter and receiving an input signal and emitting an output signal, said input circuit having a threshold level which determines the level of the output signal of the input circuit with respect to the level of the input signal, the threshold level varying as a function of variations of the temperature of the CMOS inverter;
an internal circuit receiving said output signal of said input circuit and a first power supply voltage; and
power source means, coupled to said input circuit and receiving the first power supply voltage and a reference voltage of a level different from the level of the first power supply voltage, for generating a second power supply voltage having a level which varies, within a range intermediate the respective levels of the first power supply voltage and the reference voltage, as a function of temperature and for applying the second power supply voltage to said input circuit, said input circuit responding to the variation in level of the second power supply voltage to cancel variations in the threshold level due to temperature variations, wherein said power supply means further comprises:
a first transistor having a collector receiving said first power supply voltage, a base and an emitter;
a first constant-current source connected between the base of said first transistor and a reference a node set at the reference voltage, the level thereof being lower than the level of said first power supply voltage;
a first resistor connected between the collector and base of said first transistor;
a first diode having an anode connected to the emitter of said first transistor and a cathode;
a second transistor having a base connected to the cathode of said first diode, a collector and an emitter connected through a resistive conductive path to the reference node;
a second resistor coupled between the base of the second transistor and said reference node;
a third transistor having a collector receiving said first supply voltage, a base connected to the collector of said second transistor, and an emitter at which said second power supply voltage is produced;
a third resistor connected between the collector and the base of said third transistor;

a second constant-current source connected between the base of said third transistor and said reference node; and a third constant-current source connected between the emitter of said third transistor and said reference node.

10. A semiconductor integrated circuit as claimed in claim 9, wherein said power source means further comprises a second diode having an anode connected to the cathode of said first diode and a cathode connected to the base of said first transistor.

11. A semiconductor integrated circuit as claimed in claim 10, wherein said first, second and third constant-current sources have respective control terminals receiving a common control voltage which determines the amounts of constant currents respectively generated by said first, second and third constant-current sources.

12. A semiconductor integrated circuit comprising:
an input circuit having a CMOS inverter and receiving an input signal and emitting an output signal, said input circuit having a threshold level which determines the level of the output signal of the input circuit with respect to the level of the input signal, the threshold level varying as a function of variations of the temperature of the CMOS inverter;

an internal circuit receiving said output signal of said input circuit and a first power supply voltage;

power source means, coupled to said input circuit and receiving the first power supply voltage and a reference voltage of a level different from the level of the first power supply voltage, for generating a second power supply voltage having a level which varies, within a range intermediate the respective levels of the first power supply voltage and the reference voltage, as a function of temperature and for applying the second power supply voltage to said input circuit, said input circuit responding to the variation in level of the second power supply voltage to cancel variations in the threshold level due to temperature variations;

an output circuit amplifying a signal from said internal circuit, said output circuit receiving said first power supply voltage.

* * * * *